United States Patent [19]

Goodwin et al.

[11] Patent Number: 4,639,622

[45] Date of Patent: Jan. 27, 1987

[54] BOOSTING WORD-LINE CLOCK CIRCUIT FOR SEMICONDUCTOR MEMORY

[75] Inventors: John J. Goodwin, Pleasantville; Nicky C. Lu, Yorktown Heights, both of N.Y.

[73] Assignee: International Business Machines Corporation, Armonk, N.Y.

[21] Appl. No.: 672,521

[22] Filed: Nov. 19, 1984

[51] Int. Cl.[4] .......................................... H03K 19/096
[52] U.S. Cl. .................................... 307/482; 307/264; 307/269; 307/448; 307/452
[58] Field of Search ............ 307/200 B, 443, 448–449, 307/452, 481, 482, 583, 576–579, 264, 303, 269; 357/23.6

[56] References Cited

U.S. PATENT DOCUMENTS

| | | | |
|---|---|---|---|
| 3,801,831 | 4/1974 | Dame | 307/251 |
| 3,852,625 | 12/1974 | Kubo | 307/304 |
| 3,943,377 | 3/1976 | Suzuki | 307/205 |
| 3,947,829 | 3/1976 | Suzuki | 340/173 |
| 3,982,138 | 9/1976 | Luisi et al. | 307/205 |
| 3,999,081 | 12/1976 | Nakajima | 307/205 |
| 4,000,412 | 12/1976 | Rosenthal et al. | 307/208 |
| 4,029,973 | 6/1977 | Kobayashi et al. | 307/264 |
| 4,045,691 | 8/1977 | Asano | 307/264 |
| 4,061,929 | 12/1977 | Asano | 307/246 |
| 4,211,941 | 7/1980 | Schade, Jr. | 307/303 |
| 4,216,390 | 8/1980 | Stewart | 307/264 |
| 4,496,850 | 1/1985 | Takemae et al. | 307/453 X |
| 4,550,264 | 10/1985 | Takahaski et al. | 307/482 X |
| 4,570,244 | 2/1986 | Sud et al. | 307/449 X |
| 4,574,203 | 3/1986 | Baba | 307/482 X |

Primary Examiner—John S. Heyman
Assistant Examiner—D. R. Hudspeth
Attorney, Agent, or Firm—John J. Goodwin

[57] ABSTRACT

A voltage boosting circuit combination for semiconductor memory word-lines having a charge/discharge circuit including a first pair of MOSFET's and connected to a first clock signal. An output lead is connected from the charge/discharge circuit to a word-line of a semiconductor memory. The first clock signal $\Phi A$ thereon is connected to the charge/discharge circuit for actuating the MOSFET's to produce a voltage change on the output lead from a first voltage level to a second voltage level. The circuit combination also includes a threshold voltage circuit having a second pair of MOSFET's, which is connected to a second clock signal $\Phi C$ for controlling the voltage level in the threshold voltage circuit. A lead is provided connecting the threshold voltage circuit to the charge/discharge circuit. The circuit combination further includes an output signal boosting circuit having a third pair of MOSFET's which is connected to a third clock signal $\Phi D$ for actuating the MOSFET's to produce a voltage boosting signal. A capacitor device is provided for connecting the boosting circuit to the output lead for applying the voltage boosting signal from the voltage boosting circuit to the output lead for enhancing the voltage level change on the output lead to the first voltage level from the second voltage level.

13 Claims, 6 Drawing Figures

BOOSTING WORD-LINE CLOCK CIRCUIT FOR SEMICONDUCTOR MEMORY

BACKGROUND OF THE INVENTION

1. Field of the Invention

The present invention relates to voltage boosting circuits, and more particularly to a boosting circuit for a word-line clock circuit in a semiconductor memory.

2. Description of the Prior Art

Voltage boosting circuits are described in the prior art in various configurations for a variety of purposes.

U.S. Pat. No. 4,061,929 issued Dec. 6, 1977 to Asano entitled CIRCUIT FOR OBTAINING DC VOLTAGE HIGHER THAN POWER SOURCE VOLTAGE describes a voltage boosting circuit which comprises a plurality of units connected in sequence and each composed of a condenser and a plurality of MOS-FETs without any transformer or diode.

U.S. Pat. No. 4,029,973 issued June 14, 1977 to Kobayashi et al entitled VOLTAGE BOOSTER CIRCUIT USING LEVEL SHIFTER COMPOSED OF TWO COMPLEMENTARY MIS CIRCUITS discloses an improvement for a voltage booster circuit. The improvement lies in the use of MISFETs as switching means in a level converting circuit constructed in a complementary MIS semiconductor integrated circuit and therefore the voltage loss due to the conventional switching means can be prevented.

In U.S. Pat. No. 4,216,390 issued Aug. 5, 1980 to Stewart entitled LEVEL SHIFT CIRCUIT a gating means, biased to pass current only during signal transitions, transfers binary signals from an input signal source to a latch circuit when the signal source and the latch are operated at similar voltages. Following data transfer, the operating voltage across the latch is increased. The voltage levels of the latch output signals are correspondingly increased but the state to which the latch was set is maintained and there is no steady state current conduction through the gating means.

In U.S. Pat. No. 4,045,691 issued Aug. 30, 1977 to Asano, also entitled LEVEL SHIFT CIRCUIT, a level shift circuit is disclosed including an inverter connected to a first voltage supply source and supplied with an input pulse. A condenser and a directional switching element are connected in series between the output point of the inverter and one potential point of the first voltage supply source. The input of a first MOS-FET is connected to the output of the inverter while the input of a second MOS-FET is connected to a connection point between the condenser and the directional switching element. The source of the first MOS-FET is connected to a common terminal of first and second voltage supply sources while the source of the second MOS-FET is connected to the other terminal of the second voltage supply source. An output voltage is generated between a common connecting point of the the drains of the first and second MOS-FETs and one potential point of the second voltage supply source.

Circuits for generating pulsating potentials and voltage levels outside the range of, and/or of greater magnitude than, the operating potential applied to the circuits are described in U.S. Pat. No. 4,000,412 issued Dec. 28, 1976 to Rosenthal et al entitled VOLTAGE AMPLITUDE MULTIPLYING CIRCUITS. Each circuit includes first and second transistors for applying a first voltage to one plate of a capacitor and a second voltage to the other plate of the capacitor, during one time interval. During a subsequent time interval, the first and second transistors are turned off and a third transistor applies the second potential to the one plate of the capacitor. The change in the potential at the one plate of the capacitor is coupled to the other plate of the capacitor at which is produced an output potential outside the range of the first and second voltages. The potential difference between the first voltage and the output potential difference is greater in amplitude than the potential difference between the first and second voltages. The circuit may also include means alternately applying the first voltage and then the output potential to an output point for generating pulsating signals of greater amplitude than the magnitude of the applied potential. The outputs of two or more circuits may be combined to produce direct current (d.c.) levels. Also included are circuits which operate from a pulsating source of operating potential.

Other references in the general field of voltage or level boosting include the following U.S. patents:

U.S. Pat. No. 3,999,081 by T. Nakajima entitled CLOCK-CONTROLLED GATE CIRCUIT issued Dec. 21, 1976

U.S. Pat. No. 3,982,138 by Luisi et al entitled HIGH SPEED-LOW COST, CLOCK CONTROLLED CMOS LOGIC IMPLEMENTATION issued Sept. 21, 1976

U.S. Pat. No. 3,947,829 by Y. Suzuki entitled LOGICAL CIRCUIT APPARATUS issued Mar. 30, 1976

U.S. Pat. No. 3,943,377 by Y. Suzuki entitled LOGIC CIRCUIT ARRANGEMENT EMPLOYING INSULATED GATE FIELD EFFECT TRANSISTORS issued Mar. 9, 1976

U.S. Pat. No. 3,852,625 by M. Kubo entitled SEMICONDUCTOR CIRCUIT issued Dec. 3, 1974

U.S. Pat. No. 3,801,831 by J. S. Dame entitled VOLTAGE LEVEL SHIFTING CIRCUIT issued Apr. 2, 1974.

SUMMARY OF THE INVENTION

An object of the present invention is to provide a semiconductor memory clock circuit for boosting the word-line voltage.

Another object of the present invention is to provide a semiconductor memory clock circuit wherein the word-line voltage is boosted above the supply voltage value.

A further object of the present invention is to provide a semiconductor memory clock circuit using a single supply voltage.

Still another object of the present invention is to provide a semiconductor memory CMOS clock circuit wherein no junction is forward biased.

The foregoing and other objects, features and advantages of the invention will be apparent from the following more particular description of the invention as illustrated in the accompanying drawings.

DESCRIPTION OF THE EMBODIMENT

Figure 1:
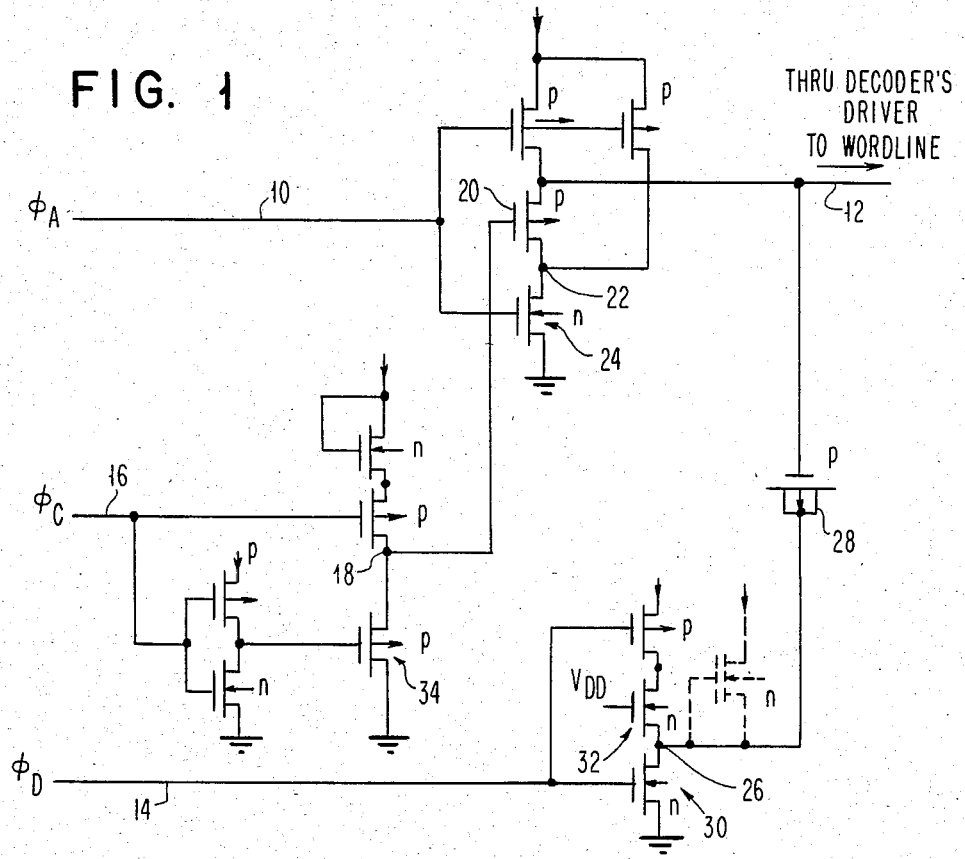
FIG. 1 is a schematic illustration of one embodiment of a semiconductor memory clock circuit according to the principles of the present invention.

In most commercial NMOS DRAM's, the word-line voltage is boosted above supply voltage VDD (which may be, for example, 5 volts) so that full signal can be stored in or read from the storage cell without threshold voltage loss. For CMOS DRAM's, PMOS transistors made in the n-well can be used as the transfer devices in the one-transistor DRAM cell. Thus, the selected word-line level changes from 5 volts to 0 volt and to negative voltage when the word-line signal is boosted. N-well CMOS technology is assumed here where the n-well is biased at 5 volts and the p-substrate is grounded. Similar principles used here can be easily adopted for p-well CMOS or other CMOS technologies. In a CMOS technology with supply voltage in the order of only 5 volts, however, a boosting word-line circuit is difficult to design. For example, a boosting level in the order of $-2$ volts cannot be applied to the NMOS source or drain, because it will forward-bias the N+P junctions to cause carrier injection, thus inducing malfunction of the dynamic circuits or even latch-up. Similarly PMOS sources and drains cannot tolerate a voltage much greater than 0.6 volts above VDD, however, undershoot and overshoot can easily occur in a boosting circuit. On the other hand, as the chip density increases up to one megabits and/or the supply voltage scales down below the standard 5 volts, the boosting word-line circuit is very important because the storage capacitor area has to be limited below a certain value to maintain reasonable chip size and the threshold loss cannot be tolerated. FIG. 1 illustrates a CMOS boosting word-line clock circuit, which can be used for CMOS DRAM's with a single supply voltage with no junction forward-biased.

In FIG. 1, $\Phi_A$ is a clock signal on lead 10 which functions to discharge and to charge the output between 0 volts and VDD (assuming 5 volts in the simulation). The output on lead 12 can be gated to the individual word-line by activating a decoder. Clock signal $\Phi_D$ on lead 14 functions to boost the output below 0 volts. Clock signal $\Phi_C$ on lead 16 is a clock signal to control the voltage at node 18 of the circuit. The key point in the circuit operation is to avoid any overshoot at PMOS source/drain and undershoot at NMOS source/drain. In order to fully discharge the output through device 20 and to avoid any undershoot at node 22, the waveform at node 18 is important. The operation of the circuit of FIG. 1 is described by also referring to the waveforms of FIGS. 3, 4, 5 and 6.

Figure 2:
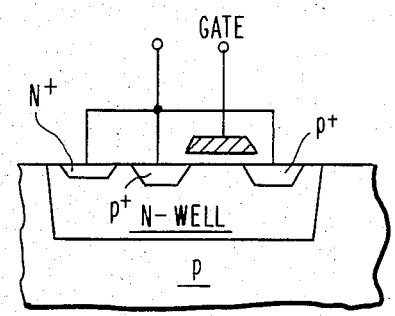
FIG. 2 is a schematic illustration of a detail of a semiconductor device used in the output circuit of FIG. 1.
Figure 3:
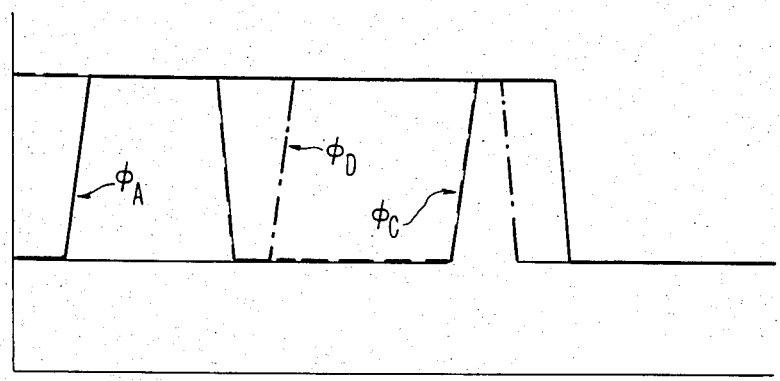
FIGS. 3, 4, 5 and 6 illustrate waveforms useful in explaining the operation of the circuit of FIG. 1.
Figure 4:
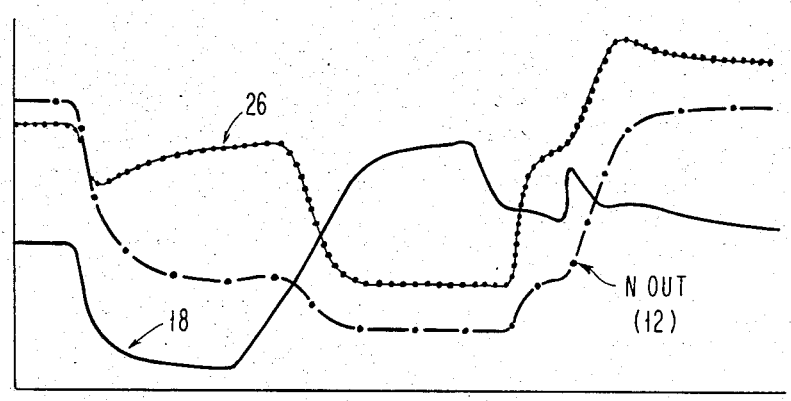
Figure 5:
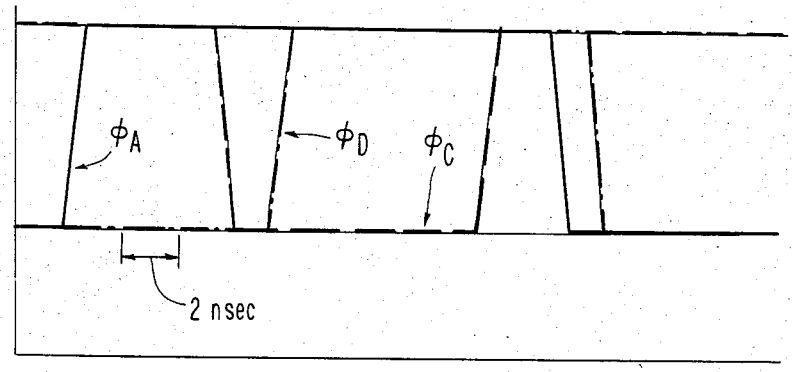
Figure 6:
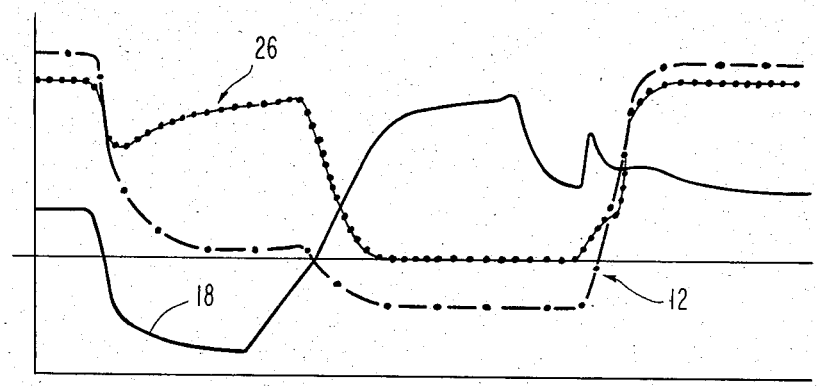

The circuit functions as follows. Before activation as shown in FIG. 3, clock signals $\Phi_A$ and $\Phi_D$ are low (0 volts) and clock signal $\Phi_C$ is high (5 volts). The output on lead 12 and node 26 is charged to high voltage and node 18 is set at VTP which is the threshold voltage of device 34. Activation starts by clock signal $\Phi_A$ on lead 10 pulling up and turning on device 24 to discharge the output. In order to keep sufficient overdrive on device 20, node 18 is designed to be self-boosted below 0 volts through the capacitance of device 20 by pulling down the output. The negative voltages at both node 18 and the output are sandwiched between two PMOS transistors to avoid any forward-biasing of junctions. After the output reaches 0 volts, clock signal $\Phi_C$ is pulled down, thus pulling up node 18 to turn off device 20 to protect undershoot at node 22 during boosting. As soon as node 18 reaches one VTP below the output level, clock signal $\Phi_D$ can be activated to pull down node 26, thus boosting output below 0 volts through a coupling capacitor of device 28. Before resetting the circuit, clock signal $\Phi_C$ has to be pulled up to pull down node 18 to avoid any self-boosting of node 18 above VDD during the output reset (the timing is not critical). Two different reset techniques can be used. The first technique is: Pull down clock signal $\Phi_D$ to charge node 26 up, then pull down clock signal $\Phi_A$ to reset the output. The output reset will boost up the node 26 which has been well protected between two NMOS transistors 30 and 32. This high voltage at node 26 will not affect the operation of the next cycle because node 26 will be coupled down right after activation of clock signal $\Phi_A$. The second scheme is: Pull down clock signal $\Phi_A$ first, reset the output, which can slightly pull up node 26. Then clock signal $\Phi_D$ is pulled down to charge node 26. Since the output reset is slower due to larger capacitance and the boosting efficiency of device 28 is somewhat degraded because device 28 operates around the cut-off region, the overshoot at the output node can be avoided. The simulation shows that, in a nominal condition, a timing skew between clock signals $\Phi_A$ and $\Phi_D$ from 1 to 3 nsec causes overshoot at output from 0 to less than 200 mV. The timing is not difficult to control because both clock signals $\Phi_C$ and $\Phi_D$ can be generated locally from clock signal $\Phi_A$. The simulation results of these two schemes are seen in FIGS. 3, 4, 5 and 6, respectively. The circuit has no dc power consumption. It should be noted that both the source and drain of device 28 (PMOS) are connected to node 26 which may have voltage higher than VDD to forward-bias the junctions. This problem is solved using a capacitor connection shown in more detail in FIG. 2. The P+ regions of device 28 are shorted to n-well through adjacent metal-bridged N+ regions.

What has been described is an improved, novel CMOS boosting word-line clock circuit which can be used for CMOS technology with a single supply voltage.

The possible junction forward-biasing is completely eliminated by putting the signal in between either two NMOS or two PMOS transistors.

A self-boosting scheme to fully overdrive the PMOS pass-gate is incorporated in the circuit, which can be also used for other similar applications. A special configuration PMOS capacitor, which can sustain voltage higher than VDD at its source and drain, is included for any boosting applications.

Having thus described our invention, what we claim as new, and desire to secure by Letters Patent is:

1. A voltage boosting circuit combination comprising a charge/discharge circuit being connectible to sources of first and second voltage levels and including a first plurality of MOSFET's, an output lead for connection from said charge/discharge circuit to a word-line of a semiconductor memory, a first input lead having an initially low voltage level clock signal $\Phi_A$ thereon connected to said charge/discharge circuit for actuating said MOSFET's to produce a voltage change on said output lead from a first voltage level to a second voltage level when said clock signal $\Phi_A$ turns on at time $t_1$, a threshold voltage circuit including a second plurality of MOSFET's and a lead connecting said threshold voltage circuit to said charge/discharge circuit for deactivating one of said MOSFET's in said charge/discharge circuit, a second input lead having an initially high voltage level clock signal $\Phi_C$ thereon connected to said threshold voltage circuit and turning off at a time $t_3$ after time $t_1$ for controlling the voltage level in said threshold voltage circuit.

an output signal boosting circuit including a third plurality of MOSFET's, a third input lead having an initially low voltage level clock signal $\Phi_D$ thereon connected to said boosting circuit and turning on at a time $t_2$ between $t_1$ time and $t_3$ for actuating said MOSFET's to produce a voltage boosting signal, wherein said clock signals $\Phi_A$ and $\Phi_D$ are initially off at said low voltage levels and said clock signal $\Phi_C$ is initially on at said high voltage level to maintain an output signal on said lead from said threshold circuit to said charge/discharge circuit, and, means connecting said boosting circuit to said output lead for applying said voltage boosting signal from said voltage boosting circuit to said output lead for boosting the voltage level change on said output lead to a third voltage level from said second voltage level.

2. A voltage boosting circuit combination according to claim 1 wherein said clock signal $\Phi_A$ on said first input lead changes from said initial low voltage level to a high voltage level to activate said charge/discharge circuit to discharge said voltage on said output lead from said first voltage level to said second voltage, level, and, wherein said output lead is connected to a common point between two MOSFET's of said first plurality of MOSFET's in said charge/discharge circuit and wherein said lead connecting said threshold voltage circuit to said charge/discharge circuit is connected to a common point between two MOSFET's of said second plurality of MOSFET's in said threshold circuit to avoid any forward biasing of N+P junctions when said voltage on said output lead changes from said first level to said second level.

3. A voltage boosting circuit combination according to claim 2 wherein said clock signal $\Phi_C$ on said second input lead changes from said initial high voltage level to a low voltage level to raise the voltage level on said lead connected between said second plurality of MOSFET's in said threshold circuit and said charge/discharge circuit to turn off one of said MOSFET's in said charge/discharge circuit.

4. A voltage boosting circuit combination according to claim 3 wherein subsequent to said clock signal $\Phi_C$ changing from said high voltage level to said low voltage level, said clock signal $\Phi_D$ on said third input lead changes from said initial low voltage level to a high voltage level to produce a voltage boosting signal from said voltage boosting circuit to said means connecting said voltage boosting circuit to said output lead, said voltage boosting signal being a signal that changes from a high voltage level to a low voltage level.

5. A voltage boosting circuit combination according to claim 4 wherein said charge/discharge circuit includes a first PMOS transistor and an NMOS transistor, said first PMOS and NMOS transistors having gate electrodes connected to said first input lead, a second PMOS transistor connected between said NMOS transistor and said first PMOS transistor, said second PMOS transistor having a gate electrode connected to said lead from said threshold voltage circuit, and said output lead is connected between said first PMOS transistor and said second PMOS transistor.

6. A voltage boosting circuit combination according to claim 4 wherein said means connecting said boosting circuit to said output lead includes a transistor device having a coupling capacitor function.

7. A voltage boosting circuit combination according to claim 6 wherein said transistor device having a coupling capacitor function includes a substrate, a potential well in said substrate, a source electrode, a drain electrode and a gate electrode, said source and drain electrodes being connected to said voltage boosting circuit said gate electrode being connected to said output lead.

8. A voltage boosting circuit combination according to claim 7 wherein said coupling capacitor function transistor potential well includes first conductivity regions and opposite conductivity regions thereon, said first conductivity region being connected to said potential well through said opposite conductivity regions forming a short circuit to provide a coupling capacitor function.

9. A voltage boosting circuit combination according to claim 5 wherein said threshold voltage circuit includes first and second PMOS transistors, connected in series, said first and second PMOS transistors each having gate electrodes, said second input lead being connected to the gate electrode of said first PMOS transistor and said lead connecting said threshold circuit to said charge/discharge circuit is connected between said first and second PMOS transistors.

10. A voltage boosting circuit combination according to claim 9 wherein said voltage boosting circuit includes two NMOS transistors connected in series, and wherein said transistor means connecting said voltage boosting circuit to said output lead is also connected between said two NMOS transistors.

11. A voltage boosting circuit combination according to claim 10 wherein said clock signals $\Phi_A$ and $\Phi_D$ are initially at low voltage levels and said clock signal $\Phi_C$ applied to said first PMOS transistor is initially at a high voltage level to maintain the connection between said first and second PMOS transistors at the threshold voltage of said second PMOS transistor.

12. A voltage boosting circuit combination according to claim 11 wherein said clock signal $\Phi_A$ on said first input lead changes from said initial low voltage level to a high voltage level to turn on said NMOS transistor in charge/discharge circuit to discharge said voltage on said output lead from said first voltage level to said second voltage level, and, wherein said output lead is connected between said first and second PMOS transistors in said charge/discharge circuit and wherein said lead connecting said threshold voltage circuit to said charge/discharge circuit is connected between said first and second PMOS transistors in said threshold circuit to avoid any forward biasing of junctions when said voltage on said output lead changes from said first level to said second level.

13. A voltage boosting circuit combination according to claim 12 wherein said clock signal $\Phi_C$ on said second input lead changes from said initial high voltage level to a low voltage level to raise the voltage level on said lead connected between said the first and second PMOS transistors in said threshold circuit and said gate electrode of said second PMOS transistor in charge/discharge circuit to turn off one of said second PMOS transistor in said charge/discharge circuit.

* * * * *

UNITED STATES PATENT AND TRADEMARK OFFICE
CERTIFICATE OF CORRECTION

PATENT NO. : 4,639,622

DATED : January 27, 1987

INVENTOR(S) : Hu Herbert Chao et al.

It is certified that error appears in the above-identified patent and that said Letters Patent is hereby corrected as shown below:

On the Title Page, [Item 75] should read:

-- Hu Herbert Chao, Pleasantville; and Nicky Chau-Chun Lu, Yorktown Height, both of N.Y.

[Item 19] "Goodwin et al." should read -- Chao et al --.

Signed and Sealed this

Twenty-second Day of September, 1987

Attest:

DONALD J. QUIGG

*Attesting Officer*    *Commissioner of Patents and Trademarks*